US 6,582,979 B2

(12) United States Patent
Coccioli et al.

(10) Patent No.: US 6,582,979 B2
(45) Date of Patent: Jun. 24, 2003

(54) STRUCTURE AND METHOD FOR FABRICATION OF A LEADLESS CHIP CARRIER WITH EMBEDDED ANTENNA

(75) Inventors: Roberto Coccioli, Thousand Oaks, CA (US); Mohamed Megahed, San Diego, CA (US); Hassan S. Hashemi, Laguna Niguel, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/916,666

(22) Filed: Jul. 26, 2001

(65) Prior Publication Data
US 2002/0167084 A1 Nov. 14, 2002

Related U.S. Application Data

(63) Continuation-in-part of application No. 09/713,834, filed on Nov. 15, 2000.

(51) Int. Cl.[7] .......................... H01L 21/00; H01L 29/82; H01L 43/00
(52) U.S. Cl. ................. 438/25; 257/421; 343/700 MS
(58) Field of Search .................... 257/421; 438/25; 343/700 MS

(56) References Cited

U.S. PATENT DOCUMENTS

| 5,506,755 | A | | 4/1996 | Miyagi et al. |
| 5,510,802 | A | * | 4/1996 | Tsuru et al. ......... 343/700 MS |
| 5,640,048 | A | | 6/1997 | Selna |
| 5,646,826 | A | | 7/1997 | Katchmar |
| 5,721,454 | A | | 2/1998 | Palmer |
| 5,786,628 | A | | 7/1998 | Beilstein, Jr. et al. |
| 5,808,873 | A | | 9/1998 | Celaya et al. |
| 5,814,889 | A | | 9/1998 | Gaul |
| 5,923,084 | A | | 7/1999 | Inoue et al. |
| 6,097,089 | A | | 8/2000 | Gaku et al. |
| 6,191,477 | B1 | | 2/2001 | Hashemi |
| 6,201,300 | B1 | | 3/2001 | Tseng et al. |
| 6,226,183 | B1 | | 5/2001 | Weber et al. |
| 6,236,366 | B1 | * | 5/2001 | Yamamoto et al. .. 343/700 MS |
| 6,265,767 | B1 | | 7/2001 | Gaku et al. |
| 6,265,771 | B1 | | 7/2001 | Ference et al. |
| 6,265,772 | B1 | | 7/2001 | Yoshida |
| 6,281,042 | B1 | | 8/2001 | Ahn et al. |
| 6,282,095 | B1 | | 8/2001 | Houghton et al. |
| 6,373,447 | B1 | * | 4/2002 | Rostoker et al. ............. 343/895 |
| 6,421,013 | B1 | * | 7/2002 | Chung ................. 343/700 MS |

FOREIGN PATENT DOCUMENTS

| EP | 2-58358 | 2/1990 |
| EP | 9-153679 | 6/1997 |
| EP | 10-313071 | 11/1998 |
| EP | 10-335521 | 12/1998 |

OTHER PUBLICATIONS

Fujitsu Limited, Presentation slides regarding "BCC (Bump Chip Carrier)," 24 pages, 1997, United States.

* cited by examiner

Primary Examiner—Carl Whitehead, Jr.
Assistant Examiner—Nema Berezny
(74) Attorney, Agent, or Firm—Farjami & Farjami LLP

(57) ABSTRACT

A substrate has a top surface for receiving a semiconductor die. An antenna is patterned on the bottom surface of the substrate. The antenna is accessible by coupling it to a via and, through the via, to a substrate signal bond pad and a semiconductor die signal bond pad. In one embodiment, there is at least one via in the substrate. The at least one via provides an electrical connection between a signal bond pad of the semiconductor die and the printed circuit board. The at least one via provides an electrical connection between a substrate bond pad and the printed circuit board. The at least one via also provides an electrical connection between the signal bond pad of the semiconductor die and a land that is electrically connected to the printed circuit board.

16 Claims, 10 Drawing Sheets

STRUCTURE AND METHOD FOR FABRICATION OF A LEADLESS CHIP CARRIER WITH EMBEDDED ANTENNA

BACKGROUND OF THE INVENTION

This application is a continuation in part of, and claims benefit of the filing date of, and hereby incorporates fully be reference, the parent application entitled "Leadless Chip Carrier Design and Structure" Ser. No. 09/713,834 filed Nov. 15, 2000 and assigned to the assignee of the present application.

FIELD OF THE INVENTION

The present invention is generally in the field of semiconductor chip packaging. More specifically, the present invention is in the field of leadless chip carrier design and structure.

BACKGROUND ART

The semiconductor fabrication industry is continually faced with a demand for smaller and more complex dies. These smaller and more complex dies must also run at higher frequencies. The requirement of smaller, more complex, and faster devices has resulted in new challenges not only in the fabrication of the die itself, but also in the manufacturing of various packages, structures, or carriers that are used to house the die and provide electrical connection to "off-chip" devices.

As an example, the demand for higher frequencies means, among other things, that "on-chip" and "off-chip" parasitics must be minimized. For example, parasitic inductance, capacitance, and resistance, which all adversely affect electrical performance of the die and its associated off-chip components must be minimized. Since RF ("Radio Frequency") semiconductor devices run at high frequencies, those devices (i.e. RF devices) constitute a significant category of devices that specially require very low parasitics.

Recently, surface mount chips and chip carriers have gained popularity relative to discrete semiconductor packages. A discrete semiconductor package typically has a large number of "pins" which may require a relatively large space, also referred to as the "footprint," to mount and electrically connect the discrete semiconductor package to a printed circuit board. Moreover, the cost and time associated with the manufacturing of the discrete semiconductor package and the cost and time associated with drilling a large number of holes in the printed circuit board are among additional reasons why alternatives such as surface mount devices and chip carriers have gained popularity.

There have been various attempts in the art to arrive at different chip carrier designs. Japanese Publication Number 10313071, published Nov. 24, 1998, titled "Electronic Part and Wiring Board Device," on which Minami Masumi is named an inventor, discloses a structure in which to dissipate heat emitted by a semiconductor device. The structure provides metallic packed through-holes formed in a wiring board that transmit heat emitted from a bare chip through a heat dissipation pattern on the bottom of the wiring board, and then to a heat dissipation plate.

Japanese Publication Number 02058358, published Feb. 27, 1990, titled "Substrate for Mounting Electronic Component," on which Fujikawa Osamu is named an inventor, discloses a substrate with a center area comprising eight thermally conductive resin-filled holes sandwiched between metal-plated top and bottom surfaces. An electronic component is then attached to the center area of the top metal-plated surface of the substrate with silver paste adhesive to improve heat dissipation and moisture resistance.

Japanese Publication Number 09153679, published Jun. 10, 1997, titled "Stacked Glass Ceramic Circuit Board," on which Miyanishi Kenji is named an inventor, discloses a stacked glass ceramic circuit board comprising seven stacked glass ceramic layers. The multi-layer stacked glass ceramic circuit board further comprises a number of via holes comprising gold or copper with surface conductors on the top and bottom surfaces covering the via holes. The top conductor functions as a heat sink for an IC chip.

Japanese Publication Number 10335521, published Dec. 18, 1998, titled "Semiconductor Device," on which Yoshida Kazuo is named an inventor, discloses a thermal via formed in a ceramic substrate, with a semiconductor chip mounted above the thermal via. The upper part of the hole of the thermal via is formed in a ceramic substrate in such a manner that it becomes shallower as it goes outward in a radial direction.

A conventional chip carrier structure for mounting a chip on a printed circuit board has a number of shortcomings. For example, conventional chip carriers still introduce too much parasitics and still do not provide a low inductance and resistance ground connection to the die. Conventional chip carriers also have a very limited heat dissipation capability and suffer from the concomitant reliability problems resulting from poor heat dissipation. As an example, in high frequency applications, such as in RF applications, several watts of power are generated by a single die. Since the semiconductor die and the chip carrier are made from different materials, each having a different coefficient of thermal expansion, they will react differently to the heat generated by the die. The resulting thermal stresses can cause cracking or a separation of the die from the chip carrier and, as such, can result in electrical and mechanical failures. Successful dissipation of heat is thus important and requires a novel structure and method.

The requirement of smaller, more complex, and faster devices operating at high frequencies, such as wireless communications devices and Bluetooth RF transceivers, has also resulted in an increased demand for small size antennas. Thus, the decrease in size of wireless communication devices has created a demand for a small size antenna that is integrated in the same "package" housing the semiconductor die coupled to the antenna. As stated above, a smaller, more complex semiconductor die operating at high frequencies requires a structure to support, house, and electrically connect the semiconductor die to a printed circuit board while providing low parasitics, efficient heat dissipation and a low inductance and resistance ground.

Therefore, there exists a need for a novel and reliable structure and method that houses, supports, and electrically connects a semiconductor die to an antenna embedded in the structure and which overcomes the problems faced by discrete semiconductor packages and conventional chip carriers. More specifically, there exists a need for a novel and reliable structure and method to embed an antenna in the structure that houses, supports and is electrically connected to a semiconductor die, while providing low parasitics, efficient heat dissipation and a low inductance and resistance ground.

SUMMARY OF THE INVENTION

The present invention is directed to structure and method for fabrication of a leadless chip carrier with embedded antenna. The present invention discloses a structure that provides efficient dissipation of heat generated by a semiconductor die. The present invention further discloses a structure that includes an embedded antenna and also provides low parasitics, and a low inductance and resistance ground connection to the semiconductor die.

In one embodiment, the present invention comprises a substrate having a top surface for receiving a semiconductor die. For example, the substrate can comprise an organic material such as polytetrafluoroethylene material or an FR4 based laminate material. By way of further example, the substrate can comprise a ceramic material. According to one aspect of the present invention, an antenna is patterned on the bottom surface of the substrate. The antenna is easily accessible by coupling it to a via and, through the via, to a substrate signal bond pad and a semiconductor die signal bond pad.

In one embodiment, the invention comprises at least one via in the substrate. The invention's at least one via provides an electrical connection between a signal bond pad of the semiconductor die and the printed circuit board. The at least one via can comprise an electrically and thermally conductive material such as copper. The at least one via provides an electrical connection between a substrate bond pad and the printed circuit board. The substrate bond pad is connected to the signal bond pad of the semiconductor die by a signal bonding wire. The at least one via also provides an electrical connection between the signal bond pad of the semiconductor die and a land that is electrically connected to the printed circuit board.

DETAILED DESCRIPTION OF THE INVENTION

The present invention is directed to structure and method for fabrication of a leadless chip carrier with embedded antenna. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
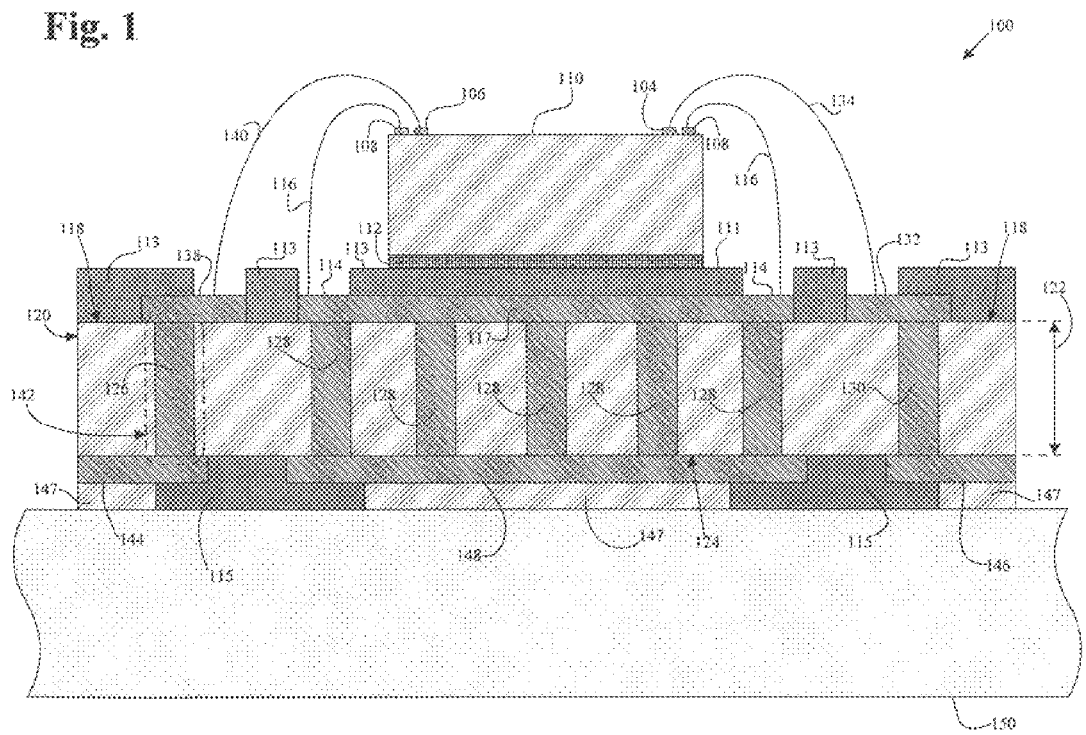
FIG. 1 illustrates a cross-sectional view of an embodiment of the present invention.

Structure 100 in FIG. 1 illustrates a cross-sectional view of an exemplary structure in accordance with one embodiment of the present invention. Structure 100 is shown as attached to printed circuit board ("PCB") 150 in FIG. 1. Referring to structure 100, semiconductor die 110 is attached to die attach pad 111 by die attach 112. It is noted that a "semiconductor die," such as semiconductor die 110, is also referred to as a "chip" or a "semiconductor chip" in the present application. Die attach pad 111 can be AUS-5 solder mask and it (i.e. die attach pad 111) refers to the segment of the solder mask directly below semiconductor die 110. The solder mask formation and patterning is discussed in more detail in later sections of the present application. However, die attach pad 111 may comprise materials other than solder mask. The thickness of die attach pad 111 can be, for example, 10.0 to 30.0 microns. Die attach 112 can comprise silver-filled epoxy or bismalemide. Generally die attach 112 can be an electrically conductive or electrically insulative, thermoset adhesive, or a combination thereof. However, in the present embodiment of the invention, die attach 112 is electrically and thermally conductive.

Solder mask 113 is applied to top surface 118 of substrate 120. The thickness of solder mask 113 can be, for example, 10.0 to 30.0 microns. Solder mask 113 can be AUS-5; however, solder mask 113 may comprise other materials. Solder mask 115 is applied to bottom surface 124 of substrate 120. The thickness of solder mask 115 can also be, for example, 10.0 to 30.0 microns. Solder mask 115 can also be AUS-5; however, solder mask 115 may comprise other materials. Support pad 117 is fabricated on top surface 118 of substrate 120 and, in one embodiment, support pad 117 can be copper. However, support pad 117 can comprise other metals. For example, support pad 117 can be aluminum, molybdenum, tungsten, or gold. It is noted that in one embodiment of the invention, semiconductor die 110 can be soldered directly to support pad 117. The fabrication of support pad 117 will be further described below in relation to FIG. 5.

Substrate down bond area 114 is fabricated on top surface 118 of substrate 120. In structure 100 in FIG. 1, substrate down bond area 114 can comprise nickel-plated copper. Substrate down bond area 114 can further comprise a layer of gold plating over the nickel-plated copper. However, substrate down bond area 114 can comprise other metals. For example, substrate down bond area 114 can be aluminum, molybdenum, tungsten, or gold. The fabrication of substrate down bond area 114 will be further described below in relation to FIG. 5. A first end of down bonding wire 116 is bonded to semiconductor die ground bond pad 108, on semiconductor die 110. A second end of down bonding wire 116 is bonded to substrate down bond area 114. Down bonding wire 116 can be gold, or can comprise other metals such as aluminum. The diameter of down bonding wire 116 can be approximately 30.0 microns or other diameter of choice.

Substrate 120 can comprise a two-layer organic laminate such as polytetrafluoroethylene. However, substrate 120 can comprise other organic materials such as FR4 based laminate. In one embodiment of the present invention, substrate 120 can be a ceramic material. In structure 100 in FIG. 1, thickness 122 of substrate 120 is approximately 200.0 microns; however, the thickness of substrate 120 can be different in other embodiments of the invention.

Continuing with FIG. 1, vias 128, also referred to as a first plurality of vias, and via 126 and via 130, also referred to as a second plurality of vias, are situated within substrate 120. Via 126, via 130, and vias 128 extend from top surface 118 to bottom surface 124 of substrate 120. Vias 126, via 130, and vias 128 can comprise a thermally conductive material. Vias 126, via 130, and vias 128 can comprise copper and, in fact, in exemplary structure 100, via 126, via 130, and vias 128 are filled with copper. However, via 126, via 130, and vias 128 can be filled with other metals without departing from the scope of the present invention. In another embodiment of the present invention, via 126, via 130, and vias 128 may not be completely filled with a metal. Generally, vias 128, via 126, and via 130 have similar structures. As such, and by way of an illustrative example, the structure of exemplary via 126 will be described in greater detail in relation to FIGS. 2A and 2B, and specifically with respect to the region enclosed by dashed line 142 (which corresponds to the region enclosed by dashed line 242 in FIG. 2B).

As shown in FIG. 1, a first end of signal bonding wire 134 is bonded to semiconductor die signal bond pad 104 on semiconductor die 110. A second end of signal bonding wire 134 is bonded to substrate signal bond pad 132. Signal bonding wire 134 can be gold or can comprise other metals such as aluminum. The diameter of signal bonding wire 134 can be 30.0 microns or other diameter of choice. As further shown in FIG. 1, a first end of signal bonding wire 140 is bonded to semiconductor die signal bond pad 106 on semiconductor die 110. A second end of signal bonding wire 140 is bonded to substrate signal bond pad 138. Signal bonding wire 140 can be gold or can comprise other metals such as aluminum. The diameter of signal bonding wire 140 can be 30.0 microns or other diameter of choice.

In FIG. 1, substrate signal bond pad 132 is fabricated on top surface 118 of substrate 120. In structure 100, substrate signal bond pad 132 can comprise nickel-plated copper. Substrate signal bond pad 132 can further comprise a layer of gold plating over the nickel-plated copper. However, substrate signal bond pad 132 can comprise other metals. For example, substrate signal bond pad 132 can be aluminum, molybdenum, tungsten, or gold. The fabrication of substrate signal bond pad 132 will be further described below in relation to FIG. 5. In structure 100 in FIG. 1, substrate signal bond pad 132 overlaps via 130. In another embodiment of the present invention, instead of overlapping via 130, substrate signal bond pad 132 "abuts" via 130.

Similar to substrate signal bond pad 132, substrate signal bond pad 138 is fabricated on top surface 118 of substrate 120. In structure 100, substrate signal bond pad 138 can comprise nickel-plated copper. Substrate signal bond pad 138 can further comprise a layer of gold plating over the nickel-plated copper. However, substrate signal bond pad 138 can comprise other metals. For example, substrate signal bond pad 138 can be aluminum, molybdenum, tungsten, or gold. The fabrication of substrate signal bond pad 138 will be further described below in relation to FIG. 5. In structure 100, substrate signal bond pad 138 overlaps via 126. In another embodiment of the present invention, substrate signal bond pad 138 abuts via 126.

Also shown in FIG. 1, land 144 is fabricated on bottom surface 124 of substrate 120. In structure 100, land 144 can comprise copper; however, land 144 can comprise other metals such as aluminum, molybdenum, tungsten, or gold. The fabrication of land 144 will be further described below in relation to FIG. 5. Land 144 is attached to printed circuit board ("PCB") 150 by solder 147. However, other methods known in the art may be used to attach land 144 to PCB 150. In structure 100, land 144 overlaps via 126. In another embodiment of the present invention, instead of overlapping via 126, land 144 abuts via 126.

Similar to land 144, land 146, is fabricated on bottom surface 124 of substrate 120. In structure 100, land 146 can be copper; however, land 146 can comprise other metals such as aluminum, molybdenum, tungsten, or gold. The fabrication of land 144 will be further described below in relation to FIG. 5. In structure 100 in FIG. 1, land 146 is attached to PCB 150 by solder 147. However, other methods known in the art may be used to attach land 146 to PCB 150. In structure 100, land 146 overlaps via 130. In another embodiment of the present invention, land 144 can abut via 126.

Further shown in FIG. 1, heat spreader 148 is fabricated on bottom surface 124 of substrate 120. In structure 100, heat spreader 148 can be copper; however, heat spreader 148 can comprise other metals such as aluminum, molybdenum, tungsten, or gold. In exemplary structure 100, heat spreader 148 is attached to PCB 150 by solder 147. However, other methods known in the art may be used to attach heat spreader 148 to PCB 150. The fabrication of heat spreader 148 will be discussed in detail in relation to FIG. 5.

Figure 2A:
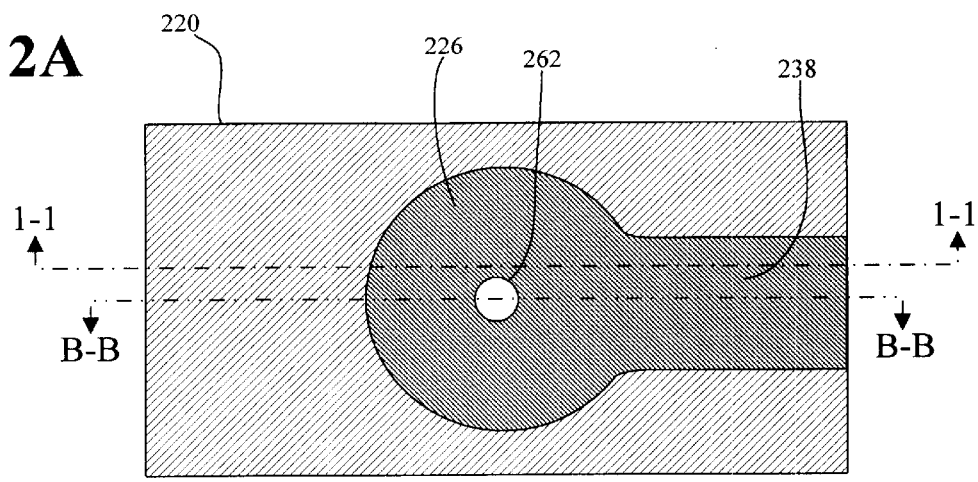
FIGS. 2A and 2B illustrate, respectively, a top view and a cross-sectional view of an exemplary via in an embodiment of the present invention.
Figure 2B:
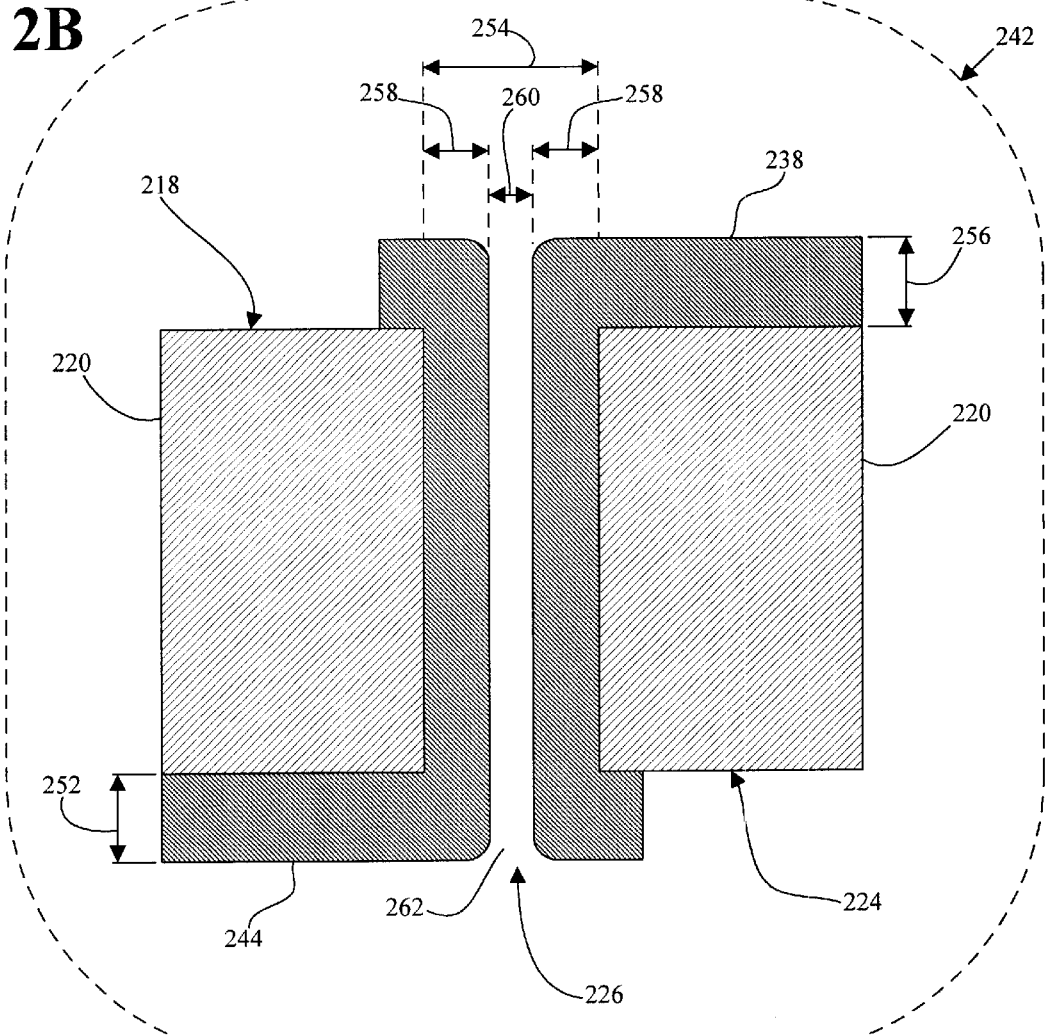

FIG. 2A shows a top view of region 242 in FIG. 2B, which corresponds to region 142 in FIG. 1. In particular, substrate 220, via 226, and substrate signal bond pad 238, respectively, correspond to substrate 120, via 126, and substrate signal bond pad 138 in FIG. 1. FIG. 2A also shows via hole 262. Via hole 262 cannot be seen in FIG. 1 which is a cross-sectional view along line 1—1 of FIG. 2A. However, via hole 262 can be seen in FIG. 2B since FIG. 2B is a cross-sectional view along line B—B of FIG. 2A. Via 226, bond pad 238, and via hole 262 will be described in detail below in relation to FIG. 2B.

FIG. 2B shows a cross-sectional view of region 242 along line B—B of FIG. 2A. However, region 142 in FIG. 1 shows a cross-sectional view along line 1—1 of FIG. 2A. In particular, top surface 218, substrate 220, bottom surface 224, via 226, substrate signal bond pad 238, and land 244 correspond, respectively, to top surface 118, substrate 120, bottom surface 124, via 126, substrate signal bond pad 138, and land 144 in FIG. 1.

In FIG. 2B, land pad thickness 252 can be approximately 12.7 to 30.0 microns. Via drill diameter 254 can be 150.0 microns while bond pad thickness 256 can be approximately 12.7 to 30.0 microns. Via wall thickness 258 can be approximately 20.0 microns. Via hole diameter 260 can be approximately 110.0 microns. It is noted that, for the purpose of ease of illustration, the various dimensions in FIGS. 2A and 2B are not drawn to scale.

The fabrication of via 226 begins with substrate 220. In one embodiment of the present invention, copper can be laminated on top surface 218 and bottom surface 224 of substrate 220. The thickness of the copper laminated on top surface 218 and bottom surface 224 of substrate 220 can be, for example, 15.0 microns. However, other metals may be laminated on top surface 218 and bottom surface 224 of substrate 220. For example, the metal laminated on top surface 218 and bottom surface 224 of substrate 220 can be aluminum, molybdenum, tungsten, or gold. Next, a via opening having via drill diameter 254 is drilled through substrate 220 at a predetermined location. Substrate 220 is then plated with copper to produce a layer of copper on the inside of the via opening corresponding to via wall thickness 258. However, substrate 220 may be plated with other metals. Thus, via 226 is fabricated having via hole diameter 262 as shown in FIGS. 2A and 2B. The process illustrated above to fabricate via 226 also applies to the fabrication of via 130 and vias 128 in structure 100 in FIG. 1.

Figure 3:
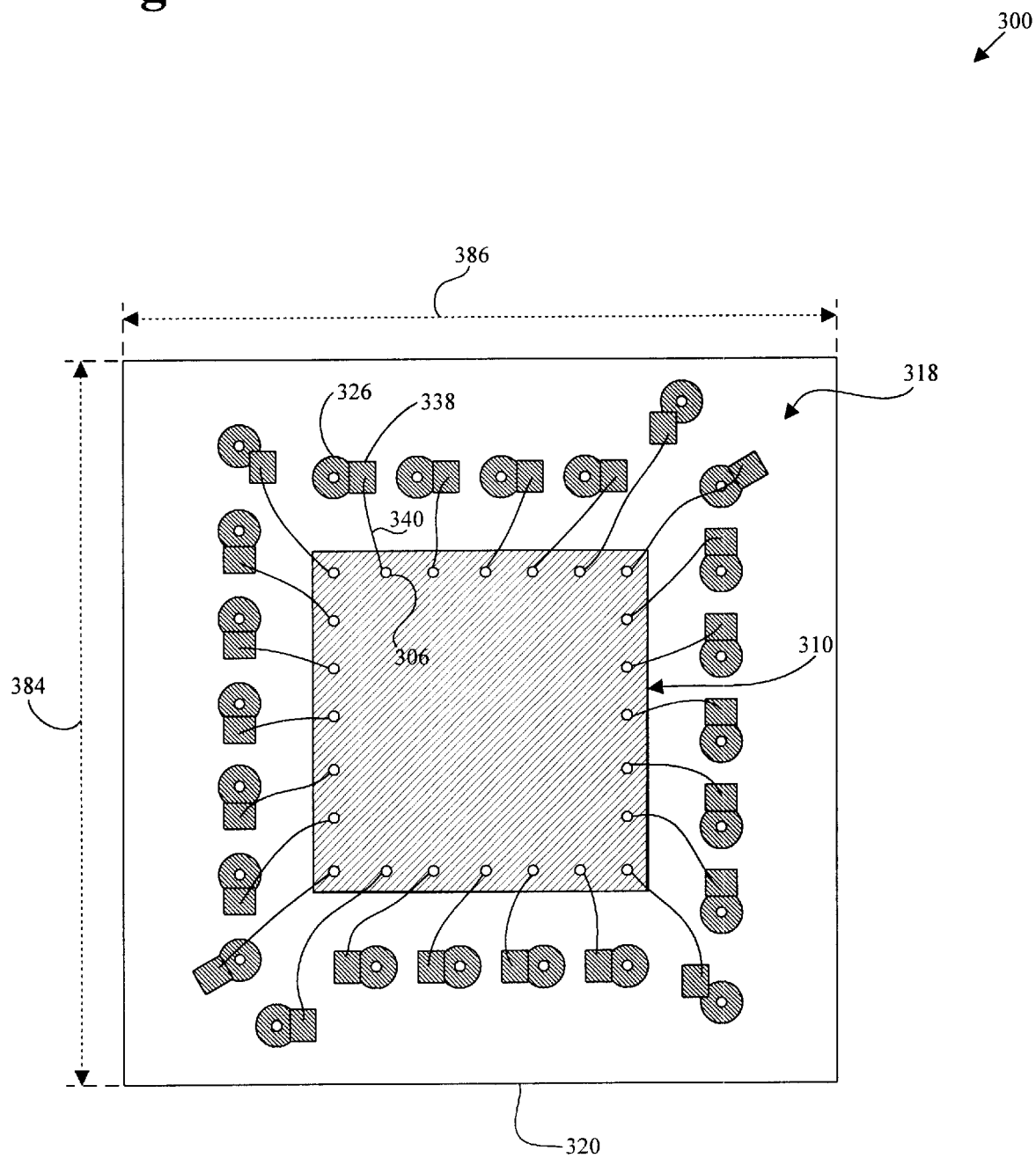
FIG. 3 illustrates a top view of an embodiment of the present invention after completion of a "saw singulation" step.

Structure 300 in FIG. 3 illustrates a top view of an exemplary structure in accordance with one embodiment of the present invention after completion of a "saw singulation" step which, briefly, involves dicing substrate 120 (FIG. 1) so as to achieve a "singulated" structure such as structure 100 in FIG. 1, corresponding to structure 300 in FIG. 3. The saw singulation step is one of the last steps in a process that is described in more detail in relation to FIG. 5. Structure 300 thus comprises substrate 320 corresponding to substrate 120 in FIG. 1. However, in contrast to structure 100 in FIG. 1, in structure 300 substrate bond pads abut, instead of overlap, the vias. For example, substrate signal bond pad 338 is shown as abutting, and not overlapping, via 326. This is in contrast to substrate signal bond pad 138 in FIG. 1, which is shown as overlapping, and not abutting, via 126. Continuing with structure 300, a first end of bonding wire 340 is bonded to substrate signal bond pad 338. A second end of bonding wire 340 is bonded to semiconductor die signal bond pad 306 on semiconductor die 310. It is noted that in FIG. 3, only via 326, substrate signal bond pad 338, bonding wire 340, and semiconductor die signal bond pad 306 are specifically discussed herein to preserve brevity.

The shape of structure 300 in FIG. 3 can be square. For example, side 384 and side 386 of substrate 320 in singulated structure 300 can each be 4.0 millimeters. By way of other examples, other square-shaped "package sizes" can be 5.0 millimeters by 5.0 millimeters, 6.0 millimeters by 6.0 millimeters, or 7.0 millimeters by 7.0 millimeters. In another embodiment, the shape of structure 300 can be rectangular. The "package size" of a rectangular-shaped embodiment can be 3.9 millimeters by 4.9 millimeters. By way of other examples, other "package sizes" of the rectangular-shaped embodiment can be 4.4 millimeters by 6.5 millimeters or 4.4 millimeters by 7.8 millimeters.

Figure 4:
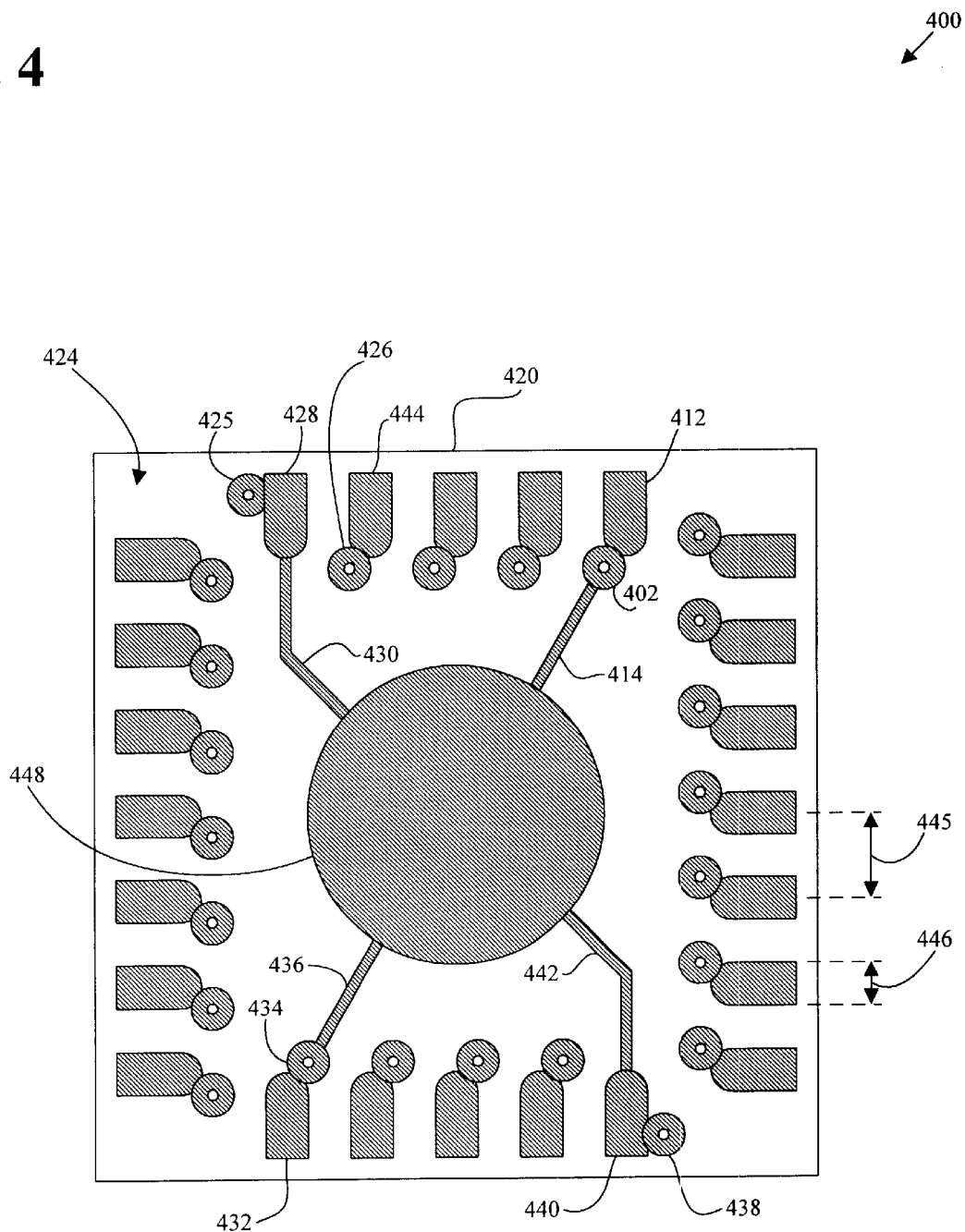
FIG. 4 illustrates a bottom view of an embodiment of the present invention after completion of a "saw singulation" step.

Structure 400 in FIG. 4 illustrates a bottom view of an exemplary structure in accordance with one embodiment of the present invention after completion of a "saw singulation" step. Structure 400 comprises substrate 420 corresponding to substrate 120 in FIG. 1. However, in contrast to structure 100 in FIG. 1, in structure 400 lands abut, instead of overlap, the vias. For example, land 444 is shown abutting, and not overlapping, via 426. This is in contrast to land 144 in FIG. 1, which is shown as overlapping, and not abutting, via 126. Additionally, traces that connect lands and vias to a heat spreader, such as traces 414, 430, 436, and 442 in FIG. 4, are not shown in structure 100 in FIG. 1.

Now discussing FIG. 4 in more detail, FIG. 4 shows bottom surface 424 of substrate 420. Lands 412, 428, 432, 440 and 444, respectively, abut vias 402, 425, 434, 438 and 426. Trace 414 connects via 402 and heat spreader 448. Trace 436 connects via 434 and heat spreader 448. Trace 430 connects land 428 and heat spreader 448. Trace 442 connects land 440 and heat spreader 448. Therefore, vias 402, 425, 434, and 438, respectively, are connected by traces 414, 430, 436, and 442 to heat spreader 448. In the exemplary embodiment shown in FIG. 4, "land pitch" 445 can be, for example, 500.0 microns and "land width" 446 can be, for example, 250.0 microns. It is noted that in FIG. 4, only vias 402, 425, 426, 434, and 438 and lands 412, 428, 432, 440, and 444 are specifically discussed herein to preserve brevity. In another embodiment, "ground traces," such as traces 414, 430, 436, and 442 in FIG. 4, are not used at all. As such, lands 412, 428, 432, and 440 in FIG. 4, would not be connected to a ground, such as heat spreader 448 in FIG. 4, but would be used as ordinary "signal" lands.

Figure 5:
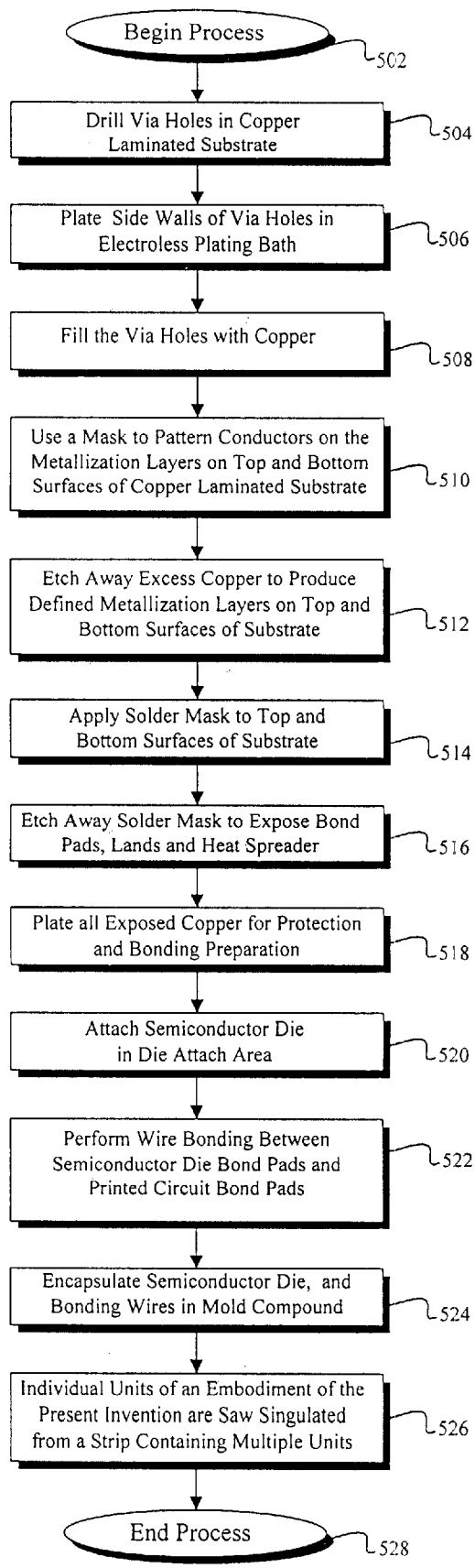
FIG. 5 illustrates a flow chart of an exemplary process by which an embodiment of the present invention is fabricated.

Referring to FIG. 5, an example of a process by which structure 100 in FIG. 1 is fabricated is now discussed. At step 502 the process begins. At step 504, via openings are drilled in a strip of copper laminated substrate. For example, the strip can be an 18-inch by 24-inch panel of copper laminated substrate. Substrate 120 in FIG. 1 corresponds to a section of the strip of the copper laminated substrate. Typically, multiple units of structure 100 are assembled on the strip of copper laminated substrate. In a later step in the assembly process, multiple assembled units of structure 100 are separated into individual units. The diameter of the via openings drilled in the copper laminated substrate can be approximately 150.0 microns.

Typically, all via openings are drilled at once using multiple diamond bits. At step 506, the sidewalls of the via openings are plated with copper in an electroless plating bath. By way of background, electroless plating refers to a method of plating that involves the deposition of metals such as copper, nickel, silver, gold, or palladium on the surface of a variety of materials by means of a reducing chemical bath. As a result of the electroless plating bath, the vias provide electrical and thermal conduction between the top and bottom surfaces of the copper laminated substrate. In one embodiment, after completion of the electroless plating process, the via hole diameter, such as via hole diameter 260 in FIG. 2B, is approximately 110.0 microns.

At step 508, the vias openings are filled with copper. Adding additional copper to the via openings increases the thermal conductivity of the vias by providing a larger cross-sectional area for thermal flow. Also, providing a larger cross-sectional area for electrical current flow increases the electrical conductivity of the vias. In the present embodiment, the via openings are partially (or almost completely) filled with copper, while in another embodiment the via openings are completely filled with copper. In one embodiment of the invention, the vias are filled with tungsten. In that embodiment, the tungsten-filled vias are strong enough to allow bonding directly onto the vias.

At step 510, a mask is used to pattern conductors on the metallization layers on the top and bottom surfaces of the substrate. In the present exemplary embodiment, the metallization layers can be copper. At step 512, the excess copper is etched away, resulting in a defined metal interconnect or metal trace pattern, also referred to as a printed circuit, on the top and bottom surfaces of the substrate. For example, in structure 400 in FIG. 4, a patterned metallization layer on bottom surface 424 includes, among other things, heat spreader 448, lands 412, 418, 428, 432, and 440, and traces 414, 430, 436, and 442.

In step 514, solder mask is applied to the top and bottom surfaces of the substrate, thereby covering the exposed patterned copper on the top and bottom surfaces of the substrate. Solder mask improves the adhesive quality of the die attach used to secure the semiconductor die to the top surface of the substrate. For example, in structure 100 in FIG. 1, solder mask 113 improves the adhesive quality of die attach 112 in securing semiconductor die 110 to top surface 118 of substrate 120. Solder mask also prevents contamination of the substrate signal bond pads, substrate down bond areas, and lands.

In step 516, solder mask is etched away to expose copper in the printed circuit areas where bonding and soldering would take place. For example, solder mask is etched away to expose substrate down bond area 114, substrate signal bond pads 132 and 138, lands 144 and 146, and heat spreader 148 in FIG. 1. In step 518, the exposed copper in the printed circuit areas, where bonding and soldering would take place, is plated with a layer of nickel, followed by a layer of gold plating on top of the nickel plated copper. The gold/nickel plating protects the exposed copper from oxidation. Also, the gold/nickel plating prepares the exposed copper for bonding at the bond pads and substrate down bond areas of the printed circuit, such as substrate signal bond pads 132 and 138 and substrate down bond area 114 in FIG. 1. Additionally, the gold/nickel plating prepares the exposed copper for soldering at the printed circuit lands and heat spreader, such as lands 144 and 146 and heat spreader 148 in FIG. 1.

At step 520, a semiconductor die is attached to the die attach pad with a die attach material. In structure 100 in FIG. 1, for example, semiconductor die 110 is attached to die attach pad 111 with die attach 112. As stated above, die attach pad 111 can be AUS-5 solder mask and it (i.e. die attach pad 111) refers to the segment of the solder mask directly below semiconductor die 110. The die attach material, for example, attach 112 shown in FIG. 1, can comprise silver-filled epoxy or bismalemide. Generally the die attach material can be an electrically conductive or electrically insulative, thermoset adhesive, or a combination thereof. In another embodiment of the present invention, the semiconductor die can be directly soldered to a support pad, such as support pad 117 in FIG. 1.

At step 522, wire bonding is performed between semiconductor die bond pads, such as semiconductor die signal bond pads 104 and 106 in FIG. 1, and printed circuit bond pads, such as substrate signal bond pads 132 and 138 in FIG. 1. In structure 300 in FIG. 3, for example, wire bonding is performed between semiconductor die bond pad 306 and substrate signal bond pad 338. In structure 100 in FIG. 1, the bonding wires used for wire bonding, such as signal bonding wires 134 and 140, can comprise gold. At step 524, the semiconductor die and the bonding wires, such as semiconductor die 110, signal bonding wires 134 and 140, and down bonding wire 116 in FIG. 1, are encapsulated in an appropriate mold compound. The mold compound provides protection from chemical contamination or physical damage in subsequent manufacturing processes and during use. The mold compound, for example, can comprise various chemical compounds, such as multifunctional epoxy, novolac, and biphenyl resin, or a combination thereof.

At step 526, the strip containing multiple assembled units of structure 100 is saw singulated into individual units. In saw singulation, individual assembled units of structure 100 are diced from the strip containing multiple assembled units of structure 100 to result in a large number of structures such as structure 100. It is noted that the process described by reference to FIG. 5 is only one method of fabricating structure 100 in FIG. 1. It is also noted that variations and modifications to the overall method or to each individual step discussed in relation to FIG. 5 are obvious to a person of ordinary skill in the art. At step 528, the exemplary process by which structure 100 in FIG. 1 is fabricated ends.

Figure 6:
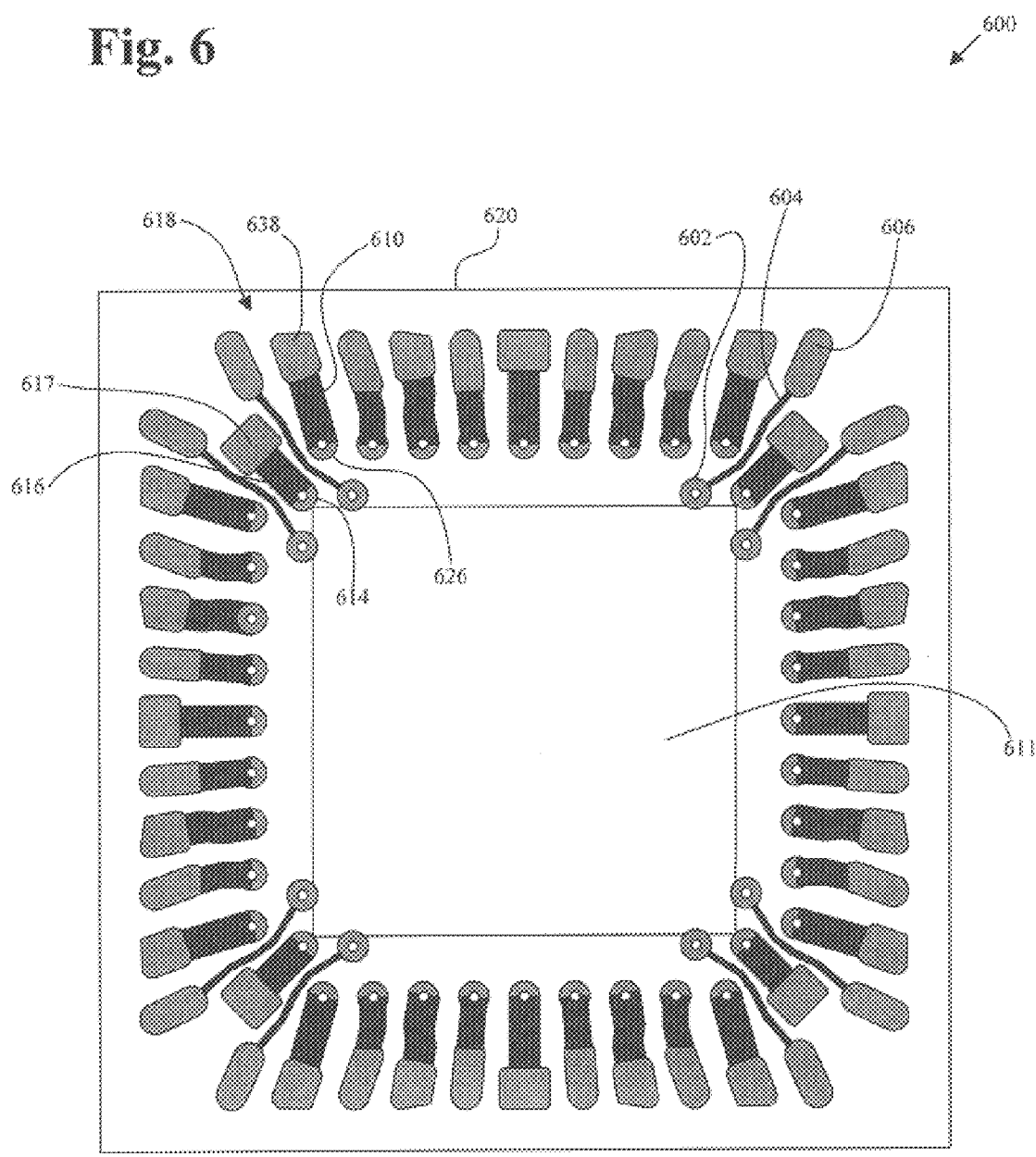
FIG. 6 illustrates a bottom view of an embodiment of the present invention after completion of a "saw singulation" step.

Structure 600 in FIG. 6 illustrates a top view of an exemplary structure in accordance with one embodiment of the present invention after completion of a "saw singulation" step. However, the semiconductor die and bonding wires are not shown in FIG. 6. Structure 600 comprises substrate 620 corresponding to substrate 120 in FIG. 1. However, in contrast to structure 100 in FIG. 1, in structure 600 substrate bond pads are connected to vias by traces. For example, trace 610 connects substrate signal bond pad 638 and via 626. In contrast, in structure 100 in FIG. 1, the bond pads overlap the vias. For example, substrate signal bond pad 138 overlaps via 126 in FIG. 1.

FIG. 6 shows top surface 618 of substrate 620. Trace 604 connects substrate bond pad 606 and via 602. As stated above, trace 610 connects substrate bond pad 638 and via 626. Trace 616 connects substrate bond pad 617 and via 614. FIG. 6 also shows the top view of die attach pad 611. It is noted that in FIG. 6, only vias 602, 626, and 614, traces 604, 610, and 616, and substrate bond pads 606, 617, and 638 are specifically discussed herein to preserve brevity.

In structure 600 in FIG. 6, via 602 is situated adjacent to die attach pad 611. Via 602 can be connected to a common ground connection, not shown in FIG. 6, such as support pad 117 in structure 100 in FIG. 1. Via 614 is situated at a corner of die attach pad 611. In structure 600, via 614 can be connected to a common ground connection, not shown in FIG. 6, such as support pad 117 in structure 100 in FIG. 1. In structure 600 in FIG. 6, "peripheral" vias, such as via 626, typically function as "signal" vias.

As stated above, in structure 600 in FIG. 6, traces 604, 610, and 616, respectively, connect substrate bond pads 606, 638, and 617 to vias 602, 626, and 614. Traces 604, 610, and 616 have different lengths. As seen in FIG. 6, substrate bond pads 606, 638, and 617, respectively, are at different distances from vias 602, 626, and 614. Also, trace 604 and trace 616 have different widths. As such, structure 600 in FIG. 6 provides design flexibility in the utilization of various substrate bond pad and via locations, trace lengths and trace widths.

As stated above, there is need in the art for a structure that houses, supports, and electrically connects a semiconductor die to an antenna embedded in the structure while providing low parasitics, efficient heat dissipation and a low inductance and resistance ground. The embodiment of the invention illustrated with respect to FIGS. 7 through 10 address the need in the art for such a structure.

Figure 7:
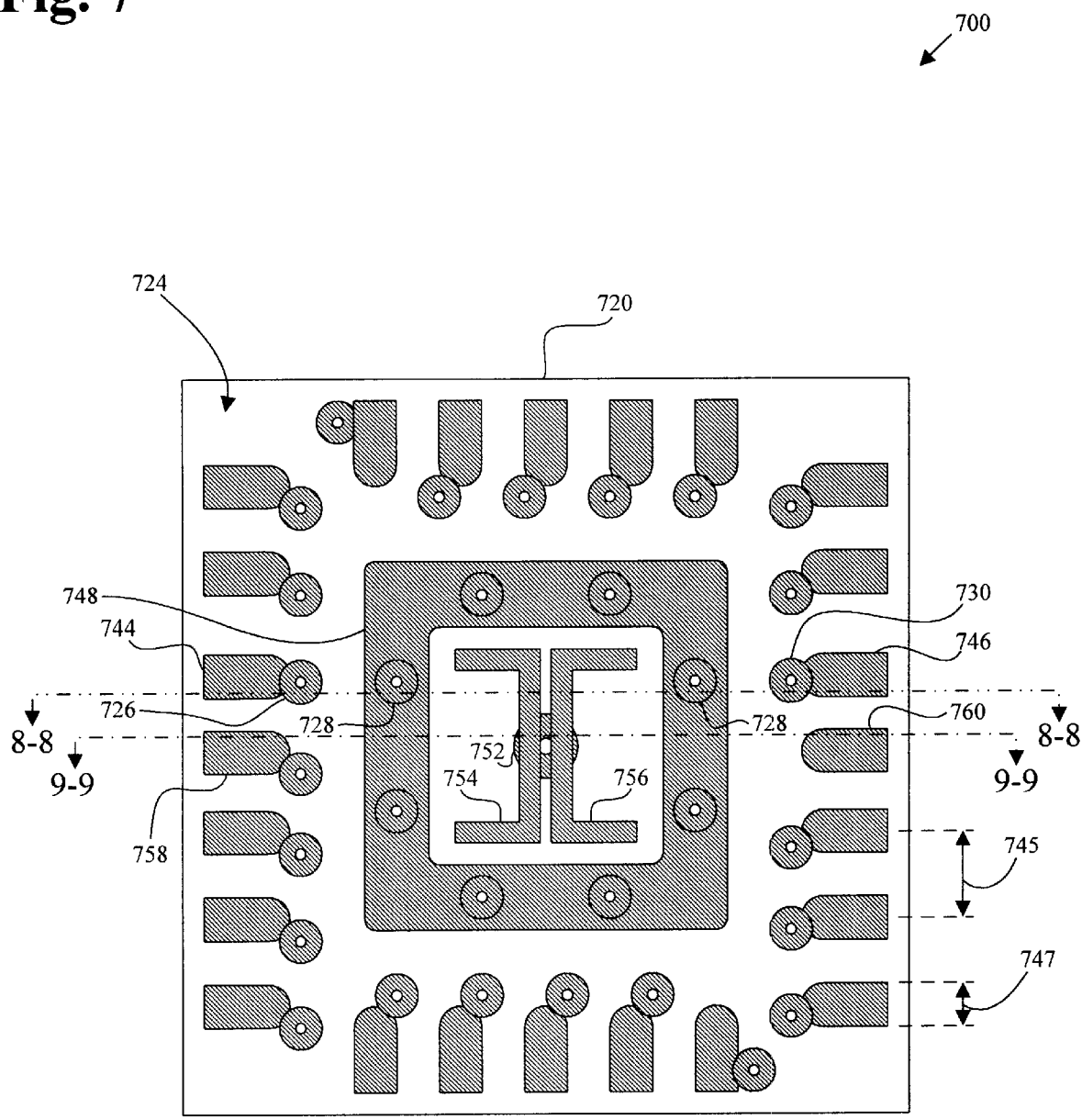
FIG. 7 illustrates a bottom view of an exemplary embedded antenna embodiment of the present invention.

Structure 700 in FIG. 7 illustrates a bottom view of an exemplary embedded-antenna structure in accordance with one embodiment of the present invention. Structure 700 comprises substrate 720 corresponding to substrate 120 in FIG. 1. However, in contrast to structure 100 in FIG. 1, structure 700 includes antenna traces 754 and 756, and via 752. Additionally, heat spreader 748 in structure 700 is shaped in the form of a square ring, whereas heat spreader 148 in structure 100 is shaped as a disk. In the present embodiment, heat spreader 748 also functions as a shield against unwanted electromagnetic radiation from reaching antenna traces 754 and 756. Heat spreader 748 also shields against unwanted electromagnetic radiation emanating from antenna traces 754 and 756 from reaching lands such as land 746. It is noted that heat spreader 748 is also referred to as a "shield" in the present application.

Now discussing FIG. 7 in more detail, FIG. 7 shows bottom surface 724 of substrate 720. Lands 744 and 746, respectively, abut vias 726 and 730. Lands 744 and 746, respectively, correspond to lands 144 and 146 in structure 100 in FIG. 1, and generally comprise the same material as lands 144 and 146. Also shown in FIG. 7, lands 744, 746, 758, and 760 are fabricated on bottom surface 724 of substrate 720. Lands 744, 746, 758, and 760 can comprise copper or other metals such as aluminum, molybdenum, tungsten, or gold.

Continuing with FIG. 7, via 726, via 730, via 752, and vias 728, are situated within substrate 720. Via 726, via 730, and vias 728, respectively, correspond to via 126, via 130, and via 128 in structure 100 in FIG. 1, and generally comprise the same material as via 126, via 130, and vias 128. Via 726, via 730, via 752, and vias 728 can comprise a thermally conductive material. Via 726, via 730, via 752, and vias 728 can comprise copper and, in fact, in exemplary structure 700, via 726, via 730, via 752 and vias 728 are filled with copper. However, via 726, via 730, via 752, and vias 728 can be filled with other metals without departing from the scope of the present invention. In another embodiment of the present invention, via 726, via 730, via 752, and vias 728 may not be completely filled with a metal.

Also shown in FIG. 7, heat spreader 748 is fabricated on bottom surface 724 of substrate 720. In structure 700, heat spreader 748 can comprise copper or other metals such as aluminum, molybdenum, tungsten, or gold. Antenna traces 754 and 756, also collectively referred to as an "antenna structure," are patterned on bottom surface 724 of substrate 720, and are connected to via 752. In the present embodiment, antenna traces 754 and 756 have a "U" shape. In other embodiments, antenna traces 754 and 756 can have different shapes. Although in the present embodiment, the "antenna structure" comprises two antenna traces, i.e. antenna traces 754 and 756, in another embodiment the "antenna structure" can comprise a single antenna trace. Antenna traces 754 and 756 can comprise copper or other metals such as aluminum, molybdenum, tungsten, or gold. In the exemplary embodiment shown in FIG. 7, land pitch 745 can be, for example, 500.0 microns and land width 747 can be, for example, 250.0 microns. It is noted that in FIG. 7, only vias 726, 728, 730, and 752, and lands 744, 746, 758, and 760 are specifically discussed herein to preserve brevity.

Figure 8:
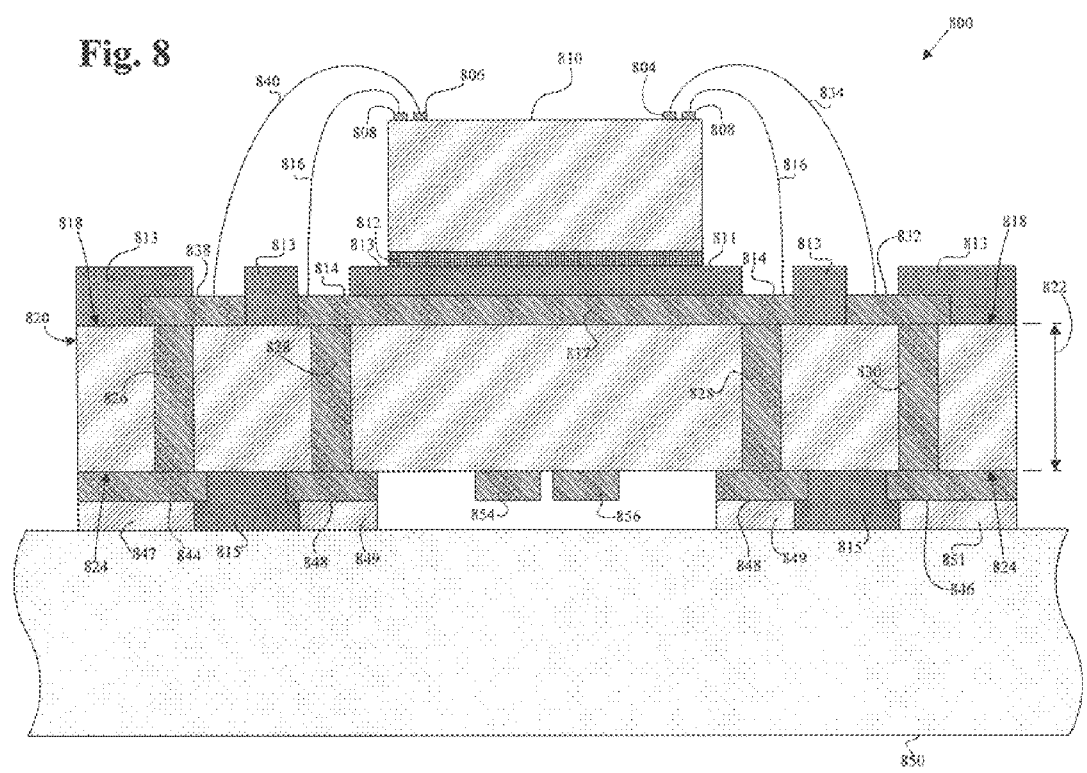
FIG. 8 illustrates a cross-sectional view of an exemplary embedded antenna embodiment of the present invention.

Structure 800 in FIG. 8 illustrates a cross-sectional view of the embedded antenna embodiment of the invention whose bottom view was shown as structure 700 in FIG. 7. Structure 800 in FIG. 8 corresponds to a cross-sectional view of structure 700 along line 8—8 in FIG. 7. However, in contrast to structure 700 in FIG. 7, in structure 800 lands overlap, instead of abut, the vias. For example, land 844 is shown overlapping, and not abutting, via 826. This is in contrast to land 744 in FIG. 7, which is shown as abutting, and not overlapping, via 726. Substrate 820 in structure 800 corresponds to substrate 720 in structure 700. Vias 826 and 830, and vias 828 in structure 800, respectively, correspond to vias 726 and 730, and vias 728 in structure 700. Lands 844 and 846 in structure 800, respectively, correspond to lands 744 and 746 in structure 700. Antenna traces 854 and 856 in structure 800, respectively, correspond to antenna traces 754 and 756 in structure 700. It is noted that in FIG. 8 structure 800 is shown as attached to PCB 850.

Now discussing FIG. 8 in more detail, FIG. 8 shows semiconductor die 810 attached to die attach pad 811 by die attach 812. Die attach pad 811 corresponds to die attach pad 111 in structure 100 in FIG. 1, and generally comprises the same material as die attach pad 111. Die attach pad 811 can be AUS-5 solder mask and it (i.e. die attach pad 811) refers to the segment of the solder mask directly below semiconductor die 810. However, die attach pad 811 may comprise materials other than solder mask. The thickness of die attach pad 811 can be, for example, 10.0 to 30.0 microns. Die attach 812 corresponds to die attach 112 in structure 100 in FIG. 1, and generally comprises the same material as die attach 112. Die attach 812 can comprise silver-filled epoxy or bismalemide. Generally die attach 812 can be an electrically conductive or electrically insulative, thermoset adhesive, or a combination thereof. However, in the present embodiment of the invention, die attach 812 is electrically and thermally conductive.

Also shown in FIG. 8, solder mask 813 is applied to top surface 818 of substrate 820. Solder mask 813 corresponds to solder mask 113 in structure 100 in FIG. 1, and generally comprises the same material as solder mask 113. The thickness of solder mask 813 can be, for example, 10.0 to 30.0 microns. Solder mask 813 can be AUS-5; however, solder mask 813 may comprise other materials. Solder mask 815 is applied to bottom surface 824 of substrate 820. The thickness of solder mask 815 can also be, for example, 10.0 to 30.0 microns. Solder mask 815 can also be AUS-5; however, solder mask 815 may also comprise other materials. Support pad 817 is fabricated on top surface 818 of substrate 820, and corresponds to support pad 117 in structure 100 in FIG. 1. In one embodiment, support pad 817 can be copper; however, support pad 817 can comprise other metals, such as aluminum, molybdenum, tungsten, or gold. It is noted that in one embodiment of the invention, semiconductor die 810 can be soldered directly to support pad 817.

Substrate down bond area 814 is fabricated on top surface 818 of substrate 820. Substrate down bond area 814 corresponds to substrate down bond area 114 in structure 100 in FIG. 1, and generally comprises the same material as substrate down bond area 114. In structure 800 in FIG. 8, substrate down bond area 814 can comprise nickel-plated copper. Substrate down bond area 814 can further comprise a layer of gold plating over the nickel-plated copper. However, substrate down bond area 814 can comprise other metals, such as aluminum, molybdenum, tungsten, or gold. Also shown in FIG. 8, a first end of down bonding wire 816 is bonded to semiconductor die ground bond pad 808 on semiconductor die 810, and a second end of down bonding wire 816 is bonded to substrate down bond area 814. Down bonding wire 816 corresponds to down bonding wire 116 in structure 100 in FIG. 1, and generally comprises the same material as down bonding wire 116. Down bonding wire 816 can be gold, or can comprise other metals such as aluminum. The diameter of down bonding wire 816 can be approximately 30.0 microns or other diameter of choice.

Also shown in FIG. 8, substrate 820 corresponds to substrate 120 in structure 100 in FIG. 1, and generally comprises the same material as substrate 120. In structure 800, substrate 820 can comprise a two-layer organic laminate such as polytetrafluoroethylene, other organic materials such as FR4 based laminate, or a ceramic material. In structure 800 in FIG. 8, thickness 822 of substrate 820 is approximately 200.0 microns; however, the thickness of substrate 820 can be different in other embodiments of the invention.

Continuing with FIG. 8, vias 828, also referred to as a first plurality of vias, and via 826 and via 830, also referred to as a second plurality of vias, are situated within substrate 820. Via 826, via 830, and vias 828 extend from top surface 818 to bottom surface 824 of substrate 820. Via 826, via 830, and vias 828, respectively, correspond to via 126, via 130, and vias 128 in structure 100 in FIG. 1, and generally comprise the same material as via 126, via 130, and vias 128. Via 826, via 830, and vias 828 can comprise a thermally conductive material. Via 826, via 830, and vias 828 can comprise copper and, in fact, in exemplary structure 800, via 826, via 830, and vias 828 are filled with copper. However, via 826, via 830, and vias 828 can be filled with other metals without departing from the scope of the present invention. In another embodiment of the present invention, via 826, via 830, and vias 828 may not be completely filled with a metal.

As shown in FIG. 8, a first end of signal bonding wire 834 is bonded to semiconductor die signal bond pad 804 on semiconductor die 810, and a second end of signal bonding wire 834 is bonded to substrate signal bond pad 832. Signal bonding wire 834 corresponds to signal bonding wire 134 in structure 100 in FIG. 1, and generally comprises the same material as signal bonding wire 134. Signal bonding wire 834 can be gold or can comprise other metals such as aluminum. The diameter of signal bonding wire 834 can be 30.0 microns or other diameter of choice. Further shown in FIG. 8, a first end of signal bonding wire 840 is bonded to semiconductor die signal bond pad 806 on semiconductor die 810, and a second end of signal bonding wire 840 is bonded to substrate signal bond pad 838. Signal bonding wire 840 can be gold or can comprise other metals such as aluminum. The diameter of signal bonding wire 840 can be 30.0 microns or other diameter of choice.

In FIG. 8, substrate signal bond pad 832 is fabricated on top surface 818 of substrate 820. Substrate signal bond pad 832 corresponds to substrate signal bond pad 132 in structure 100 in FIG. 1, and generally comprises the same material as substrate signal bond pad 132. In structure 800, substrate signal bond pad 832 can comprise nickel-plated copper, and can further comprise a layer of gold plating over the nickel-plated copper. However, substrate signal bond pad 832 can comprise other metals such as aluminum, molybdenum, tungsten, or gold. In structure 800 in FIG. 8, substrate signal bond pad 832 overlaps via 830. In another embodiment of the present invention, instead of overlapping via 830, substrate signal bond pad 832 "abuts" via 830.

Similar to substrate signal bond pad 832, substrate signal bond pad 838 is also fabricated on top surface 818 of substrate 820. Substrate signal bond pad 838 corresponds to substrate signal bond pad 138 in structure 100 in FIG. 1, and generally comprises the same material as substrate signal bond pad 138. In structure 800, substrate signal bond pad 838 can comprise nickel-plated copper. Substrate signal bond pad 838 can further comprise a layer of gold plating over the nickel-plated copper. However, substrate signal bond pad 838 can also comprise other metals, such as aluminum, molybdenum, tungsten, or gold. In structure 800, substrate signal bond pad 838 overlaps via 826. In another embodiment of the present invention, substrate signal bond pad 838 "abuts" via 826.

Also shown in FIG. 8, land 844 is fabricated on bottom surface 824 of substrate 820. Land 844 corresponds to land 144 in structure 100 in FIG. 1, and generally comprises the same material as land 144. In structure 800, land 844 can comprise copper; however, land 844 can comprise other metals such as aluminum, molybdenum, tungsten, or gold. Land 144 is attached to PCB 850 by solder 847. However, other methods known in the art may be used to attach land 844 to PCB 850. In structure 800, land 844 overlaps via 826. In another embodiment of the present invention, land 844 "abuts" via 826.

Continuing with FIG. 8, land 846, is fabricated on bottom surface 824 of substrate 820. Land 846 corresponds to land 146 in structure 100 in FIG. 1, and generally comprises the same material as land 146. In structure 800, land 846 can be copper; however, land 846 can comprise other metals such as aluminum, molybdenum, tungsten, or gold. In structure 800 in FIG. 8, land 846 is attached to PCB 850 by solder 851. However, other methods known in the art may be used to attach land 846 to PCB 850. In structure 800, land 846 overlaps via 830. In another embodiment of the present invention, land 846 "abuts" via 830.

FIG. 8 also shows cross-sectional portions 848 of heat spreader 748 of FIG. 7. For ease of reference, cross-sectional portions 848 of heat spreader 748 are referred to simply as heat spreader 848. As shown in FIG. 8, heat spreader 848 is fabricated on bottom surface 824 of substrate 820. In structure 800 in FIG. 8, heat spreader 848 is attached to PCB 850 by solder 849. However, other methods known in the art may be used to attach heat spreader 848 to PCB 850.

Also shown in FIG. 8, are cross sectional portions of antenna traces 854 and 856 which correspond to antenna traces 754 and 756 in structure 700 of FIG. 7. However, for ease of reference, cross-sectional portions of antenna traces 854 and 856 in FIG. 8 are referred to simply as antenna traces 854 and 856. FIG. 8 illustrates how antenna traces 854 and 856 are shielded by heat spreader 848 from both sides. More specifically, it is seen in FIG. 8 that lands 844 and 846 are shielded from antenna traces 854 and 856 by heat spreader 848. It is noted that heat spreader 848 is also referred to as a "shield" in the present application.

Figure 9:
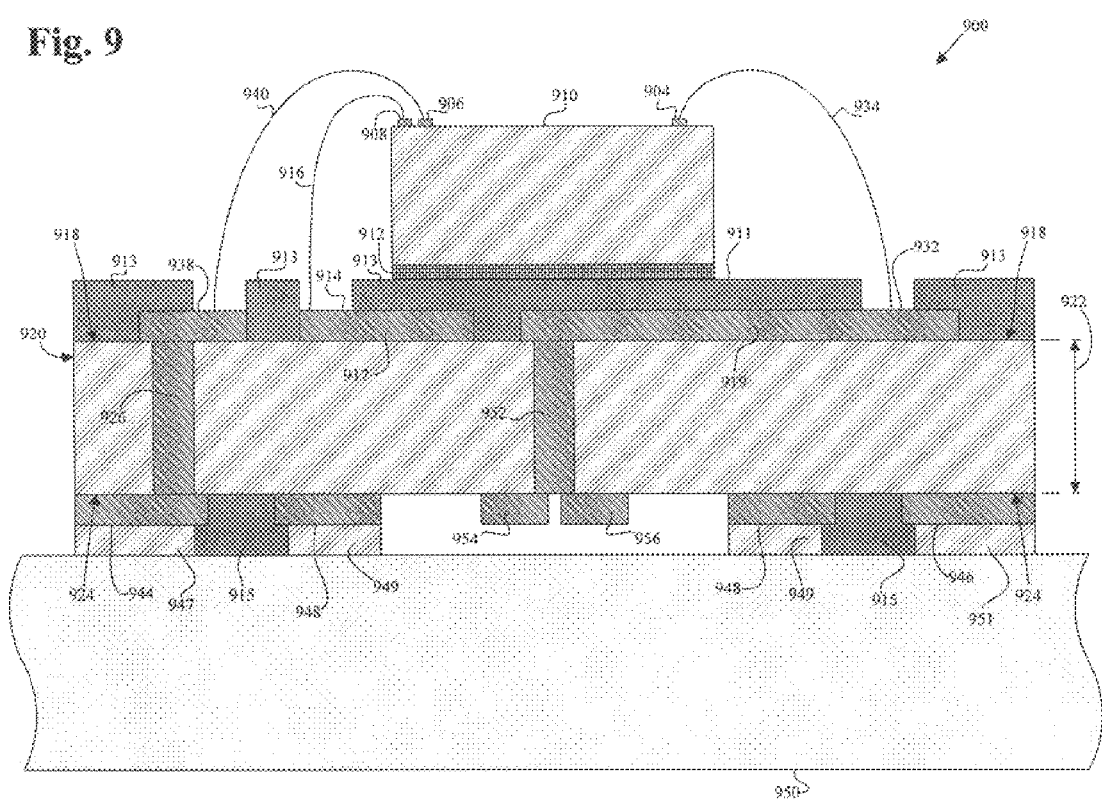
FIG. 9 illustrates another cross-sectional view of an exemplary embedded antenna embodiment of the present invention.

Structure 900 in FIG. 9 illustrates another cross-sectional view of the embedded antenna embodiment of the invention whose bottom view was shown as structure 700 in FIG. 7. Structure 900 in FIG. 9 corresponds to a cross-sectional view of structure 700 along line 9—9 in FIG. 7. In contrast with the cross-sectional view of structure 700 shown in FIG. 8, the cross-sectional view of structure 700 shown in FIG. 9 is taken at a point showing a cross-sectional view of via 752 in FIG. 7, as well as cross-sectional views of antenna traces 754 and 756 and heat spreader 748. It is noted that the cross-sectional view of structure 700 shown in FIG. 8 is not taken at the point where via 752 (FIG. 7) is situated.

In structure 900, substrate 920 corresponds to substrate 720 in structure 700, and also corresponds to substrate 820 in structure 800 in FIG. 8. Via 926 corresponds to via 726 in structure 700, and also corresponds to via 826 in structure 800. Via 952 corresponds to via 752 in structure 700. Lands 944 and 946, respectively, correspond to lands 744 and 746 in structure 700, and also correspond to lands 844 and 846 in structure 800. FIG. 9 also shows cross-sectional portions 948 of heat spreader 748 of FIG. 7. For ease of reference, cross-sectional portions 948 of heat spreader 748 are referred to simply as heat spreader 948.

Also shown in FIG. 9, are cross sectional portions of antenna traces 954 and 956 which correspond to antenna traces 754 and 756 in structure 700 of FIG. 7. However, for ease of reference, cross-sectional portions of antenna traces 954 and 956 in FIG. 9 are referred to simply as antenna traces 954 and 956. FIG. 9 illustrates how antenna traces 954 and 956 are shielded by heat spreader 948 from both sides. More specifically, it is seen in FIG. 9 that lands 944 and 946 are shielded from antenna traces 954 and 956 by heat spreader 948.

Now discussing other elements in FIG. 9, semiconductor die 910 is shown attached to die attach pad 911 by die attach 912. Semiconductor die 910, die attach pad 911, and die attach 912, respectively, correspond to semiconductor die 810, die attach pad 811, and die attach 812 in structure 800 in FIG. 8. Solder mask 913 is applied to top surface 918 of substrate 920, and solder mask 915 is applied to bottom surface 924 of substrate 920. Solder masks 913 and 915 in structure 900, respectively, correspond to solder masks 813 and 815 in structure 800. Support pad 917 is fabricated on top surface 918 of substrate 920, and corresponds to support pad 817 in structure 800. Substrate down bond area 914 is fabricated on top surface 918 of substrate 920, and corresponds to substrate down bond area 814 in structure 800.

Also shown in FIG. 9, a first end of down bonding wire 916 is bonded to semiconductor die ground bond pad 908 on semiconductor die 910, and a second end of down bonding wire 916 is bonded to substrate down bond area 914. Down bonding wire 916, semiconductor die ground bond pad 908, and semiconductor die 910 in structure 900, respectively, correspond to down bonding wire 816, semiconductor die ground bond pad 808, and semiconductor die 810 in structure 800 in FIG. 8. Vias 926 and 952 are situated within substrate 920, and extend from top surface 918 to bottom surface 924 of substrate 920.

Continuing with FIG. 9, a first end of signal bonding wire 934 is bonded to semiconductor die signal bond pad 904 on semiconductor die 910, and a second end of signal bonding wire 934 is bonded to substrate signal bond pad 932. A first end of signal bonding wire 940 is bonded to semiconductor die signal bond pad 906 on semiconductor die 910, and a second end of signal bonding wire 940 is bonded to substrate signal bond pad 938. Substrate signal bond pads 932 and 938 are fabricated on top surface 918 of substrate 920.

Further shown in FIG. 9, trace 919 connects substrate signal bond pad 932 and via 952. Trace 919 is fabricated on top surface 918 of substrate 920. In structure 900, trace 919 can comprise copper or other metals such as aluminum, molybdenum, tungsten, or gold. Lands 944 and 946 are fabricated on bottom surface 924 of substrate 920. In structure 900 in FIG. 9, lands 944 and 946, respectively, are attached to PCB 950 by solders 947 and 951.

Also shown in FIG. 9, antenna traces 954 and 956 are fabricated on bottom surface 924 of substrate 920, and are connected to trace 919 by via 952. In another embodiment (not illustrated in any of the drawings), antenna traces 954 and 956 can be soldered to PCB 950, and routed by a trace on PCB 950 to a land, such as land 944 in FIG. 9. In such an embodiment, an opening in heat spreader (or "shield") 948 must be made so that the trace can be routed from antenna traces 954 and 956 to a land, such as land 944. Also, in such an embodiment, antenna traces 954 and 956 can be connected to a bond pad, such as semiconductor die signal bond pad 906, by way of, for example, land 944, via 926, substrate signal bond pad 938, and signal bonding wire 940 in FIG. 9.

Figure 10:
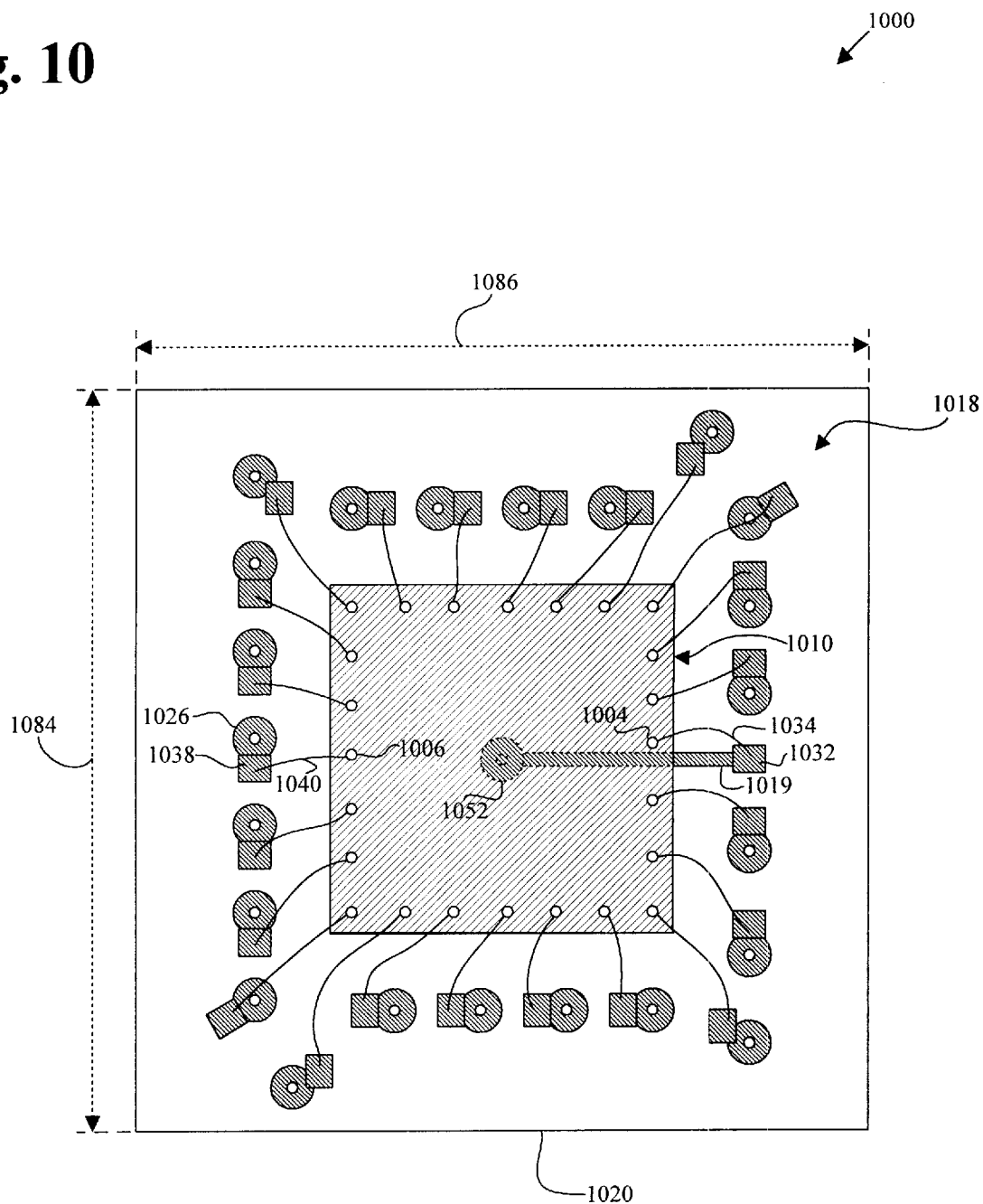
FIG. 10 illustrates a top view of an exemplary embedded antenna embodiment of the present invention.

Structure 1000 in FIG. 10 illustrates a top view of the embedded antenna embodiment of the invention whose bottom view was shown as structure 700 in FIG. 7, and whose two exemplary cross-sectional views were shown as structures 800 and 900 in FIGS. 8 and 9. Structure 1000 comprises substrate 1020, which corresponds to substrate 920 in FIG. 9 (or substrate 820 in FIG. 8). However, in contrast to structure 900 in FIG. 9, and structure 800 in FIG. 8, in structure 1000 substrate signal bond pads abut, instead of overlap, the vias. For example, substrate signal bond pad 1038 is shown abutting, and not overlapping, via 1026. This is in contrast to substrate signal bond pad 938 in FIG. 9, which is shown as overlapping, and not abutting, via 926. Similarly, this is in contrast to substrate signal bond pad 838 in FIG. 8, which is shown as overlapping, and not abutting, via 826.

In structure 1000 in FIG. 10, semiconductor die 1010 corresponds to semiconductor die 810 in structure 800 in FIG. 8, and also corresponds to semiconductor die 910 in structure 900 in FIG. 9. Trace 1019 and vias 1026 and 1052, respectively, are top views of trace 919 and vias 926 and 952 in structure 900. Substrate signal bond pads 1032 and 1038, respectively, correspond to substrate signal bond pads 932 and 938 in structure 900 in FIG. 9. Signal bonding wires 1034 and 1040, respectively, correspond to signal bonding wires 934 and 940 in structure 900 in FIG. 9. It is noted that in FIG. 10, only vias 1026 and 1052, substrate signal bond pads 1032 and 1038, and signal bonding wires 1032 and 1040 are specifically discussed herein to preserve brevity.

Now discussing FIG. 10 in more detail, semiconductor die 1010 is attached to top surface 1018 of substrate 1020. A first end of signal bonding wire 1034 is bonded to substrate signal bond pad 1032, and a second end of signal bonding wire 1034 is bonded to semiconductor die signal bond pad 1004 on semiconductor die 1010. A first end of signal bonding wire 1040 is bonded to substrate signal bond pad 1038, and a second end of signal bonding wire 1040 is bonded to semiconductor die signal bond pad 1006 on semiconductor die 1010. Trace 1019 connects substrate signal bond pad 1032 and via 1052. As shown by dashed lines in FIG. 10, via 1052 and a part of trace 1019 are situated underneath semiconductor die 1010. It is also noted that the embedded antenna embodiment of the invention, whose different views were illustrated in structures 700, 800, 900, and 1000, is fabricated using process steps similar to those described in relation to FIG. 5 and, as such, the process steps are not repeated here.

The electrical and thermal characteristics of the embedded antenna embodiment of the invention shown in FIGS. 7, 8, 9, and 10 are now discussed by using structure 800 in FIG. 8 as a specific exemplary cross-sectional view of the embedded antenna embodiment of the invention. In structure 800, down bonding wire 816 provides an electrical ground connection between semiconductor die ground bond pad 808 on semiconductor die 810 and substrate down bond area 814. Substrate down bond area 814 is situated in close proximity to semiconductor die 810. By situating substrate down bond area 814 in close proximity to semiconductor die 810, structure 800 provides a minimal length electrical ground connection between semiconductor die ground bond pad 808 and substrate down bond area 814.

Support pad 817 functions as a "ground plane" for semiconductor die 810 by providing semiconductor die ground bond pads with a large common ground connection. Thus, semiconductor die ground pad 808 is electrically connected to substrate down bond area 814 by down bonding wire 816, and substrate down bond area 814 is part of support pad 817. Since substrate down bond area 814 is part of support pad 817, structure 800 provides a minimal length electrical ground connection between semiconductor die ground pad 808 and support pad 817. Also, vias 828 electrically connect support pad 817 and heat spreader 848. Thus, substrate down bond area 814, support pad 817, vias 828, and heat spreader 848 combine to provide a minimal length, low resistance, and low inductance ground connection between semiconductor die ground pad 808 and heat spreader 848.

Additionally, in structure 800 in FIG. 8, a large number of vias 828 can be used. Since vias 828 are electrically connected in parallel between support pad 817 and heat spreader 848, they (i.e. vias 828) provide a much lower resistive and inductive path between support pad 817 and heat spreader 848 than the resistive and inductive path that would have been provided by a single via. Thus, through the utilization of multiple vias, such as vias 828 in FIG. 8, structure 800 provides a low resistance, low inductance, minimal length electrical ground connection between support pad 817 and heat spreader 848.

One advantage of the present invention is that substrate down bond area 814 is of sufficient size to allow a procedure known as "double bonding" to further minimize the parasitic inductance and resistance generated by down bonding wire 816. In "double bonding," two down bonding wires are connected in parallel between a semiconductor die ground bond pad and a substrate down bond area. In structure 800, for example, two down bonding wires can be connected between semiconductor die ground bond pad 808 on semiconductor die 810 in FIG. 8, and substrate down bond area 814. The parasitic inductance and resistance generated by two parallel down bonding wires between semiconductor die ground bond pad 808 and substrate down bond area 814 would be approximately one half the parasitic inductance and resistance generated by a single down bonding wire.

In the embodiment of the invention shown in FIG. 8, substrate signal bond pads 832 and 838, respectively, overlap vias 830 and 826. Also, lands 846 and 844, respectively, overlap vias 830 and 826. Thus, vias 830 and 826 provide minimal length electrical connections between substrate signal bond pads 832 and 838, respectively, and lands 846 and 844. As such, through the utilization of "overlapping" vias 830 and 826, respectively, structure 800 minimizes the parasitic inductance generated between substrate signal bond pads 832 and 838, and lands 846 and 844. In other words, the fact that no interconnect lines are required to connect to vias 830 and 826 results in a reduction of parasitic inductance and resistance that would otherwise be introduced by the interconnect lines.

Moreover, as seen by reference to structure 800 in FIG. 8, the present embodiment provides thermal conduction of excess heat away from semiconductor die 810 by way of support pad 817, vias 828, and heat spreader 848. In structure 800, vias 828 can be filled with a thermally conductive metal such as copper. Adding additional copper to vias 828 increases their cross-sectional area. Thus, providing a larger cross-sectional area through which heat can be thermally conducted increases the thermal conductivity of vias 828. In structure 800, support pad 817 can be a thermally conductive metal such as copper. Also, the large surface area of support pad 817 provides a large conduit for the conduction of heat generated by semiconductor die 810. Similarly, heat spreader 848, which is also used as a shield for antenna traces 854 and 856, can be a thermally conductive metal such as copper and the large surface area of heat spreader 848 provides a large conduit for the conduction of heat flowing through vias 828. Vias 828 also provide an efficient and "multiple" thermal connection between support pad 817 and heat spreader 848. Thus, through the utilization of support pad 817, vias 828, and heat spreader 848, structure 800 provides an effective mechanism to dissipate heat generated by semiconductor die 810.

It is noted that a difference may exist in the coefficient of thermal expansion ("CTE") of structure 800 in FIG. 8, and PCB 850 because of a difference in the materials used to fabricate structure 800 and PCB 850. As a result, when structure 800 heats up due to operating or environmental factors, structure 800 may expand at a different rate than PCB 850. The difference in the rate of expansion of structure 800 and PCB 850 creates a corresponding strain on the "solder joint" that connects structure 800 and PCB 850. The "solder joint" comprises the individual solder connections, referred to as solders 847 and 851, respectively, in FIG. 8, between PCB 850 and lands 844 and 846, and the solder connection, also referred to as solder 849, between PCB 850 and heat spreader 848. However, heat spreader 848 is much larger in size than lands 844 and 846. The proportionally larger size of heat spreader 848 allows heat spreader 848 to absorb a corresponding larger amount of the overall strain on its "solder joint." Therefore, heat spreader 848 increases the physical reliability of structure 800 by absorbing a large amount of the overall strain on its "solder joint."

Referring to FIG. 9, it is seen that antenna traces 954 and 956 are electrically connected to semiconductor die signal bond pad 904 on semiconductor die 910 by way of via 952, trace 919, substrate signal bond pad 932, and signal bonding wire 934. In other words, semiconductor die 910 is coupled to antenna traces 954 and 956 by way of semiconductor die signal bond pad 904, signal bonding wire 934, substrate signal bond pad 932, trace 919, and via 952. Semiconductor die 910 and antenna traces 954 and 956 are "shielded" from each other by support pad 917, which is connected to ground by way of vias (not shown in FIG. 9), such as vias 828 in FIG. 8, and heat spreader 948. As such, the present embodiment of the invention provides a structure and method that houses, supports, and electrically connects a semiconductor die to an antenna embedded in the structure. Moreover, the present embodiment of the invention provides structure and method to embed an antenna in the structure that houses, supports and is electrically connected to a semiconductor die, while providing low parasitics, efficient heat dissipation and a low inductance and resistance ground.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, although in the exemplary embedded antenna embodiment of the invention described above, the antenna structure is patterned on the bottom surface of the substrate, the antenna structure may very well be patterned on the top surface of the substrate. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure and method for fabrication of a leadless chip carrier with embedded antenna have been described.

What is claimed is:

1. A structure comprising:
   a substrate having a top surface and a bottom surface;
   a die attached to said top surface of said substrate;
   an antenna attached to said substrate;
   a printed circuit board permanently attached to said bottom surface of said substrate;
   a first via in said substrate;
   said first via providing an electrical connection between a die signal bond pad and said printed circuit board.

2. The structure of claim 1 wherein said antenna is patterned on said bottom surface of said substrate, said antenna being coupled to a first substrate signal bond pad.

3. The structure of claim 2 wherein said die is a semiconductor die.

4. The structure of claim 2 wherein said substrate comprises an organic material.

5. The structure of claim 2 wherein said substrate comprises a ceramic material.

6. The structure of claim 2 wherein said first via provides an electrical connection between a second substrate signal bond pad and said printed circuit board, wherein said second substrate signal bond pad is electrically connected to said die signal bond pad.

7. The structure of claim 6 wherein said second substrate signal bond pad is electrically connected to said die signal bond pad by a bonding wire.

8. The structure of claim 2 wherein said first via provides an electrical connection between said die signal bond pad and a land, said land being electrically connected to said printed circuit board.

9. The structure of claim 2 wherein said first via provides an electrical connection between a second substrate signal bond pad and a land, wherein said second substrate signal bond pad is electrically connected to said die signal bond pad, and wherein said land is electrically connected to said printed circuit board.

10. The structure of claim 9 wherein said second substrate signal bond pad is electrically connected to said die signal bond pad by a bonding wire.

11. The structure of claim 2 wherein said first via comprises a thermally conductive material.

12. The structure of claim 2 wherein said antenna is coupled to said first substrate signal bond pad by a second via in said substrate.

13. The structure of claim 2 further comprising a heat spreader attached to said bottom surface of said substrate.

14. The structure of claim 13 wherein said heat spreader is a shield for said antenna.

15. The structure of claim 14 wherein said antenna is coupled to said first substrate signal bond pad by a second via in said substrate.

16. The structure of claim 1 wherein said antenna is patterned on said top surface of said substrate.

* * * * *